United States Patent [19]

Haulin

[11] Patent Number: 4,975,876

[45] Date of Patent: Dec. 4, 1990

[54] METHOD FOR ARRANGING A READ-ONLY MEMORY FOR READING OUT UPDATING STATUS INFORMATION IN AN INTEGRATED CIRCUIT

[75] Inventor: Tord L. Haulin, Upsala, Sweden

[73] Assignee: Telefonaktiebolaget L M Ericsson, Stockholm, Sweden

[21] Appl. No.: 287,145

[22] Filed: Dec. 21, 1988

[30] Foreign Application Priority Data

Jan. 18, 1988 [SE] Sweden ................................. 8800144

[51] Int. Cl.[5] .......................... G11C 17/00; G11C 7/00
[52] U.S. Cl. ........................................ 365/94; 365/201
[58] Field of Search ................. 365/94, 103, 201, 104; 371/21.1

[56] References Cited

U.S. PATENT DOCUMENTS 4,414,665 10/1983 Kimura et al. .................. 365/201 X
4,451,903 5/1984 Jordan .................................... 365/94

Primary Examiner—Stuart N. Hecker
Assistant Examiner—Michael A. Whitfield
Attorney, Agent, or Firm—Burns, Doane, Swecker & Mathis

[57] ABSTRACT

The present invention relates to a method for arranging a read memory for reading electrically updating status information from an integrated circuit (3) which comprises various circuit layers. Patterned circuit layers, so-called pattern layers, are produced, for instance, from a respective mask which has been made particularly for each of the pattern layers. According to the invention, each pattern layer in which reconstruction can be made has provided therein a separate memory device, such that when changes are made in one such pattern, the updating status of the pattern layer can be written into the memory device in code form. The memory devices included in an integrated circuit form a read-only-memory which is programmed so that the pattern layers in which a memory device is provided contain a code which is individual to its own updating status. At the same time as the updating status code is written into the memory device, the code is also written into a test device (2) as reference information. When checking the circuit, a test program (5) in the test device (2) reads the updating statuses of the pattern layers and compares them with the reference information, the result of this comparison indicating the updating status of the integrated circuit.

1 Claim, 1 Drawing Sheet

METHOD FOR ARRANGING A READ-ONLY MEMORY FOR READING OUT UPDATING STATUS INFORMATION IN AN INTEGRATED CIRCUIT

TECHNICAL FIELD

The present invention relates to a method for arranging a read-only-memory (ROM) in an integrated circuit comprised of various circuit layers. Patterned circuit layers, so-called pattern layers, are each produced, for instance, from a separate mask which has been manufactured specifically for each pattern layer concerned. The read-only-memory is used to read-out the circuit updating status relating to the updating of circuit patterns.

BACKGROUND ART

When updating a circuit, there is first produced one or more new circuit masks to replace or renew the mask or masks in which pattern changes have been made. A new circuit of the same kind as the earlier circuit, but having a new updating status, is produced from the newly manufactured, revised masks and the remaining old masks of the original circuit. When practicing known techniques, the circuit cover is marked with a code which identifies the updating status of the circuit and which is checked prior to installing or fitting the circuit, so as to ensure that a circuit having the correct updating status is fitted. This code check is made ocularly.

Mask programmable read-only-memories are known in connection with integrated circuits. The memory content of these read-only-memories is determined by the configuration or design of one of the pattern layers, the pattern of which is defined by one of the circuit masks, a programming mask. When this type of mask-programmed, read-only-memory is used for code circuit updating, an updating of one pattern layer will result in a desired pattern change in the mask corresponding to said pattern layer and also in a pattern change (programming) on the programming mask, so as to code the new updating status of the circuit. Thus, both mask which corresponds to the revised or updated pattern layer and the programming mask are renewed before new circuits incorporating the new updating status can be produced.

DISCLOSURE OF INVENTION

The problem associated with ocular reading of the updating status of a circuit is that a reading error may be made. An error made in reading the updating status of a circuit can be very expensive, should the circuit be fitted and delivered prior to discovering the error. There is also a danger that the wrong code will be marked on the circuit cover, when such marking procedures are employed.

The problem of using mask programmable read-only-memories in accordance with the present standpoint of techniques is that when updating one or more mask layers it is necessary to manufacture a new programming mask in addition to renewing the masks of the updated pattern, since the contents of the read-only-memory must be changed (reprogrammed) to indicate the updating. Because the costs of manufacturing a mask are significant, each updating becomes expensive, since the memory mask needs to be renewed with each programming change.

The invention, which solves the aforesaid problems, is characterized in the following claims and involves providing in each pattern layer liable to reconstruction a separate memory device which in the event of changes to one such pattern layer, is operative in writing-in (programming) the current updating status of the pattern layer, e.g. in binary code form. These memory devices are included in an integrated circuit and form a read-only-memory which can be programmed so that each of the pattern layers in which a memory device is arranged will contain an updating code which is individual to that particular layer. This code is written into a test device as reference information, at the same time as the code relating to updating status is written into the memory device. When carrying out a test run, a test program in the test device reads the updating status of respective pattern layers and compares these statuses with the reference information, the result of this comparison disclosing the updating status of the integrated circuit.

The inventive method enables the updating status of a circuit to be read electrically without using an additional pattern layer in the circuit as a read-only-memory device. When a mask which corresponds to a pattern layer is updated, the memory device in the mask is programmed at the same time, so as to contain information concerning this updating. The fact that programming of updating status is effected in the same mask as that in which said updating was made represents a considerable economic advantage, since it obviates the necessity of using a newly manufactured additional memory mask with each program change.

BRIEF DESCRIPTION OF DRAWING

The inventive method will now be described in more detail with the aid of an exemplifying embodiment thereof and with reference to the accompanying drawings, in which.

BEST MODE FOR CARRYING OUT THE INVENTION

An integrated circuit is composed of a plurality of circuit layers. Patterned circuit layers, so-called pattern layers, may be produced, for instance, from so-called masks using photolithographic methods. The pattern layer may also be produced photolithographically from stepper reticles, where the pattern layers are exposed directly. One mask forms the pattern of one pattern layer. Normally mask patterns are configured with the aid of a CAD-system and the masks are then produced from the patterns stored in the CAD-system.

Figure 1:
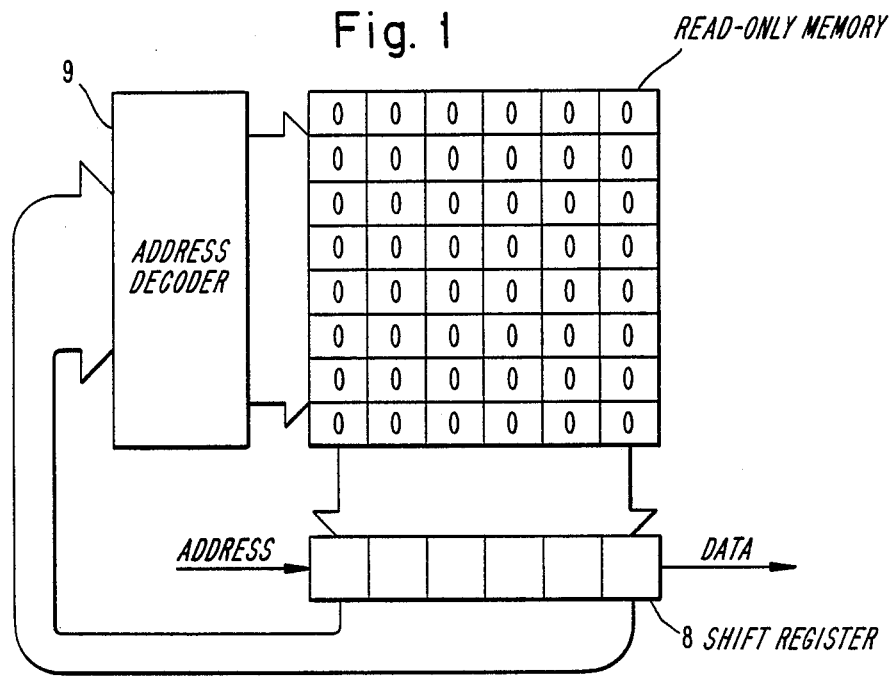
FIG. 1 is a block schematic of a read-only-memory connected to a shift register.

It is becoming more and more usual to update circuits and therewith that users of circuits must be capable of identifying the updating status of the circuits they use. An updating of one given type of circuit involves updating one or more masks of the circuit in the CAD-system and then manufacturing said updated masks. These updated masks together with the remainder of the masks belonging to this circuit are then used to produce new circuits of the same kind as the previous circuit, but with a new updating status. In order to enable the updating status of a circuit to be identified electrically in a circuit checking process, the integrated circuit is provided with a read-only-memory (ROM) which is operative in reading information relating to the updating status of the circuit. The read-only memory arrangement is such that each of several pattern layers includes an individual memory device which has written (programmed) therein a code which identifies the updating status of the pattern layer, so that each pattern layer which includes a memory device is provided with its personal updating status code. This code may be a binary code, for instance. The updating status of respective different pattern layers determines the updating status of the integrated circuit. A memory device comprises a mask programmable memory area in a pattern layer. The read-only memory (ROM) consists of said memory areas, which are programmed in the masks corresponding to the pattern layers, at the time of configuring the circuit pattern of the pattern layer. Each pattern layer in which reconstructions can be made includes a memory-area in which the updating status of the layer is found. However, those pattern layers which are updated automatically as a result of updating another layer do not include a memory area for coding updating information, since updating in such a layer is obvious. Thus, memory areas are only found in one part of the pattern layers for which it is significant to code updating, so as to enable the updating status of the circuit to be identified. FIG. 1 illustrates data in a read memory (ROM) 1 which incorporates twelve memory areas, each of four bits. Each four bit memory area is framed. The read-only memory 1 is found in an original circuit which includes twelve pattern layers, each having an individual memory area. No updating has been made in the circuit. Consequently, the memory is programmed with zeros in all memory areas, which indicates that none of the pattern layers has been updated. Each of these pattern layers thus includes a memory area containing a code which discloses the updating status of the pattern layer, i.e. for which operation in the sequence the pattern layer has been updated.

Figure 2:
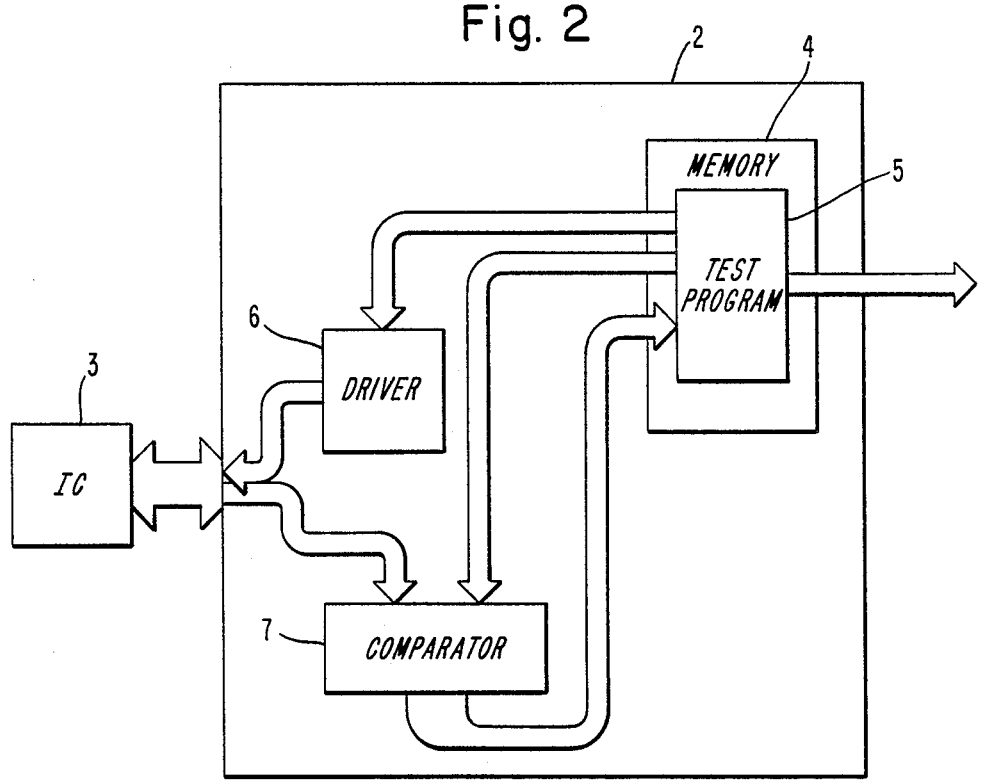
FIG. 2 is a schematic diagram which illustrates the flow of information in a test device to which an integrated circuit is connected.

The aforesaid circuit checking procedure is effected with the aid of a test device 2 to which the integrated circuit 3 is connected in accordance with FIG. 2, this Figure showing an information flow model for the test device. A memory 4 in the test device contains a test program 5 in which there are stored routines for reading and checking the codes of the updating layers of the various pattern layers. The test program 5 also contains codes for the updating status of the respective different pattern layers, these codes constituting reference information enabling the updating status of the circuit to be identified in conjunction with the memory reading procedure.

When wishing to make a change in the function of the circuit, those masks which are relevant to this change are reconstructed, so as to achieve the desired circuit function. For instance, assume that a change desired in the circuit function results in the updating of three of the circuit pattern layers which contain memory areas. The pattern of the masks corresponding to these pattern layers is updated with the aid of the aforesaid CAD-system. At the same time as the circuit patterns of the three masks are updated, the memory areas of the masks are reprogrammed, by making pattern changes in said areas, in order to mark that the masks have been updated. Since this updating is assumed to be the first updating that has been made in the circuit, the memory areas are programmed with ones in the least significant bits, which signifies that the new masks are updated. The three updated masks are renewed. The three updated masks and the remaining non-updated masks are used to manufacture new circuits of the same kind as previously, but with a first updating status, referenced for instance R1.

Reference information relating to the new updating status R1 is written into the test program 5, prior to checking the updated circuits. Each pattern change in a mask is accompanied by programming of the read-only memory 1 and writing of the changed updating status into the test program.

As before mentioned, the test device is used to check the updating status of a circuit. When making this check, the integrated circuit is connected to the test device 2, in accordance with FIG. 2. During this check, the test program 5 is steered or controlled by a driver 6 in the test device, such as to collect the content of the memory 1 of the integrated circuit 3 (see FIG. 1) and to deliver this content to a comparator 7 in the test device. The memory content is collected in the following manner; of FIG. 1. An address of a word in the read-only-memory is read from the test program 5 into a shift register 8 included in the integrated circuit. The address is delivered from the shift register to an address decoder 9 in the circuit, which points out or indicates the addressed word in the memory 1. According to the illustrated example, a word includes one bit from each of six memory areas. The indicated word is delivered from the read-only memory 1 to the shift register 8 and from there in data form to the comparator 7 in the test device 2 (see FIG. 2). The test program 5 delivers the aforesaid reference information to the comparator 7, in which data from the read-only memory of the integrated circuit 3 is compared with the reference information, the result of this comparison being sent to the test program. As a result of this circuit check, the test program will indicate whether or not the updating status of the integrated circuit coincides with that expected. The test program may also be configured so that the result of the circuit check will indicate directly the updating status of the circuit.

The read-only memory may also be provided with a further memory device having programmed therein a code for the kind of circuit concerned. This will enable the kind of circuit involved to be read-out during said circuit checking procedure.

What is claimed is:

1. A method of identifying an update status of an integrated circuit having a plurality of pattern layers, said method comprising the steps of:

providing a separate memory device in at least one of said pattern layers to form a read-only memory;

writing an original status code in the separate memory device of the at least one of said pattern layers, said status code adapted to indicate an individual update status of the at least one pattern layer;

writing the original status code into a test device to provide a reference status code;

writing a new status code in the separate memory device of the at least one of said pattern layers when the at least one of said pattern layers is changed;

reading the status code from said separate memory device; and comparing the read status code to the reference status code wherein the result of the comparison indicates the update status of the integrated circuit.

* * * * *